(12) United States Patent
Aikou

(10) Patent No.: US 10,168,499 B2
(45) Date of Patent: Jan. 1, 2019

(54) ELECTRONIC MODULE

(71) Applicant: KYOCERA Corporation, Kyoto-shi, Kyoto (JP)

(72) Inventor: Youhei Aikou, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/513,638

(22) PCT Filed: Sep. 3, 2015

(86) PCT No.: PCT/JP2015/075093
§ 371 (c)(1),
(2) Date: Mar. 23, 2017

(87) PCT Pub. No.: WO2016/047417
PCT Pub. Date: Mar. 31, 2016

(65) Prior Publication Data
US 2017/0285281 A1    Oct. 5, 2017

(30) Foreign Application Priority Data

Sep. 24, 2014   (JP) .................................. 2014-193938

(51) Int. Cl.
*G02B 6/42* (2006.01)
*H05K 1/18* (2006.01)
*H01L 25/16* (2006.01)

(52) U.S. Cl.
CPC ........... *G02B 6/428* (2013.01); *G02B 6/4206* (2013.01); *H05K 1/18* (2013.01); *H01L 25/167* (2013.01)

(58) Field of Classification Search
CPC .................................. G02B 6/42; G02B 6/428
(Continued)

(56) References Cited

U.S. PATENT DOCUMENTS 5,463,229 A * 10/1995 Takase .................. H01L 25/042
257/434
6,625,036 B1 * 9/2003 Horio .................. H01L 31/0203
257/E31.095
(Continued)

FOREIGN PATENT DOCUMENTS

JP    10-041540 A    2/1998
JP    2001-077407 A    3/2001
(Continued)

OTHER PUBLICATIONS

Taiwan Notification of Reason for Refusal with English concise explanation, Taiwan Patent Application No. 104131650, dated Jan. 19, 2017, 6 pgs.

*Primary Examiner* — Kaveh C Kianni
(74) *Attorney, Agent, or Firm* — Volpe and Koenig, P.C.

(57) ABSTRACT

In an electronic module 30, a groove 3 is disposed in a single side surface A of an electronic device 20 that faces an outer principal surface 33 of a circuit board 31. In the groove 3, an end portion of a mounting electrode 2 near a joining body 21 is located further toward an insulating substrate 1 than an end portion 3 of the groove 3 near the joining body 21. A fillet F of a joining material 41 is disposed in a region of the groove 3 near the joining body 21. Owing to the fillet F, the reliability of connection between the electronic device 20 and the circuit board 31 can be increased.

7 Claims, 11 Drawing Sheets

(58) Field of Classification Search
USPC .......................................................... 385/14
See application file for complete search history.

(56) References Cited

U.S. PATENT DOCUMENTS

| | | | | |
|---|---|---|---|---|
| 2003/0201462 | A1* | 10/2003 | Pommer | G02B 6/4201 257/200 |
| 2004/0212030 | A1* | 10/2004 | Asai | G02B 6/12002 257/432 |
| 2005/0087747 | A1* | 4/2005 | Yamada | G02B 6/43 257/80 |
| 2005/0161587 | A1* | 7/2005 | Mihara | H01L 21/6835 250/214 R |
| 2006/0164817 | A1* | 7/2006 | Yoshida | H01L 31/0203 361/749 |
| 2007/0051877 | A1* | 3/2007 | Sakai | G02B 6/421 250/214 R |
| 2007/0147729 | A1* | 6/2007 | Dellmann | G02B 6/4232 385/14 |
| 2012/0128292 | A1* | 5/2012 | Hamamura | G02B 6/4201 385/14 |
| 2014/0036204 | A1* | 2/2014 | Doyle | G02F 1/133608 349/65 |
| 2014/0334137 | A1* | 11/2014 | Hasenoehrl | H01L 25/0753 362/147 |

FOREIGN PATENT DOCUMENTS

| | | |
|---|---|---|
| JP | 2003-008066 A | 1/2003 |
| TW | 201407242 A | 2/2014 |

\* cited by examiner (a)

(b)

(a)

(b)

(a)

(b)

ELECTRONIC MODULE

TECHNICAL FIELD

The present invention relates to an electronic module including an insulating substrate having a side surface with a groove in which a mounting electrode is disposed.

BACKGROUND ART

Electronic components, such as light emitting-receiving devices including optical semiconductor devices, such as semiconductor laser diodes (LD), light emitting diodes (LED), photo diodes (PD), and image sensors, are commonly mounted on wiring boards described below.

The wiring boards include an insulating substrate having a rectangular plate shape and wiring conductors disposed on, for example, a principal surface or a side surface of the insulating substrate. The wiring conductors include mounting electrodes for electrically connecting an electronic component to a circuit board.

For example, the electronic component is mounted on a mounting portion provided on the principal surface of the insulating substrate. The mounted electronic component is connected to portions of the wiring conductors, which extend from the mounting portion to the mounting electrodes, and are electrically connected to the mounting electrodes through the wiring conductors. A joining body may be joined to the insulating substrate. The joining body includes a lens and a connector for transmitting optical signals between the electronic component and an external electronic circuit. An electronic module (for example, a photoelectric conversion module) is formed by electrically connecting the mounting electrodes to connecting circuit portions on the circuit board with a conductive joining material, such as solder.

CITATION LIST

Patent Literature

PTL 1: Japanese Unexamined Patent Application Publication No. 2003-8066
PTL 2: Japanese Unexamined Patent Application Publication No. 2001-77407
PTL 3: Japanese Unexamined Patent Application Publication No. 10-41540

SUMMARY OF INVENTION

Technical Problem

In recent years, in accordance with a decrease in the size of electronic components, the wiring board has been reduced in size and increased in density, and the areas of the mounting electrodes have been reduced. Also, many electronic modules are formed by so-called side-surface mounting in which the mounting electrodes are disposed on a side surface of the insulating substrate and the insulating substrate is mounted so that a side surface thereof faces a principal surface of the circuit board on which the connecting circuit portions are disposed. In this structure, the mounting electrodes on the side surface of the insulating substrate and the connecting circuit portions on the circuit board face each other and are connected to each other by a joining material, such as solder.

Examples of side-surface mounting are described in, for example, PTL 1 to 3. In these structures, grooves are formed in the side surface of the insulating substrate, and the mounting electrodes are disposed in the grooves. The mounting electrodes face the circuit board and are connected to the connecting circuit portions. The electronic module is formed by mounting the insulating substrate so that the side surface thereof faces the principal surface of the circuit board.

When an electronic device is mounted on the circuit board by side-surface mounting, the mounting electrodes are disposed on the side surface of the insulating substrate, which has a relatively small surface area. Therefore, the influence of a reduction in the sizes of the mounting electrodes is significant. Accordingly, it has become more and more important to increase the reliability of connection between the mounting electrodes and the connecting circuit portions on the circuit board when, for example, a thermal stress is generated between the insulating substrate and the circuit board.

Solution to Problem

An electronic module according to an aspect of the present invention includes an electronic device, a circuit board, and a joining material. The electronic device includes an insulating substrate, a joining body, and a mounting electrode. The insulating substrate includes a first principal surface on which a light emitting-receiving device is mounted and a side surface perpendicular to the first principal surface. The joining body includes an end surface at which an end portion of an optical transmission path extending through the joining body is disposed and a side surface perpendicular to the end surface. The end surface faces the first principal surface of the insulating substrate and is joined to the first principal surface in a state in which the end portion of the optical transmission path is positioned with respect to the light emitting-receiving device. The side surface is continuous with the side surface of the insulating substrate and defines a single side surface together with the side surface of the insulating substrate. The mounting electrode is disposed on an inner surface of a groove in the single side surface and extends in a thickness direction perpendicular to the first principal surface of the insulating substrate. The circuit board includes a board body including an outer principal surface and a connecting circuit portion disposed on the outer principal surface of the board body. The joining material connects the mounting electrode to the connecting circuit portion and mounts the electronic device on the circuit board in a state in which the single side surface of the electronic device faces the outer principal surface of the circuit board. An end portion of the mounting electrode near the joining body is located further toward the insulating substrate than an end portion of the groove near the joining body, and a fillet of the joining material is disposed in a region of the groove near the joining body.

Advantageous Effects of Invention

Since the electronic module according to the aspect of the present invention has the above-described structure, the fillet is reliably formed in an end portion of the joining material near the joining body. The fillet extends from the mounting electrode to the connecting circuit portion of the circuit board in the groove in the single side surface of the electronic device. Owing to the fillet, the thermal stress, for example, is reduced. Thus, an electronic module in which the reliability of connection between the electronic device and the circuit board can be increased can be provided.

DESCRIPTION OF EMBODIMENTS

Figure 1:
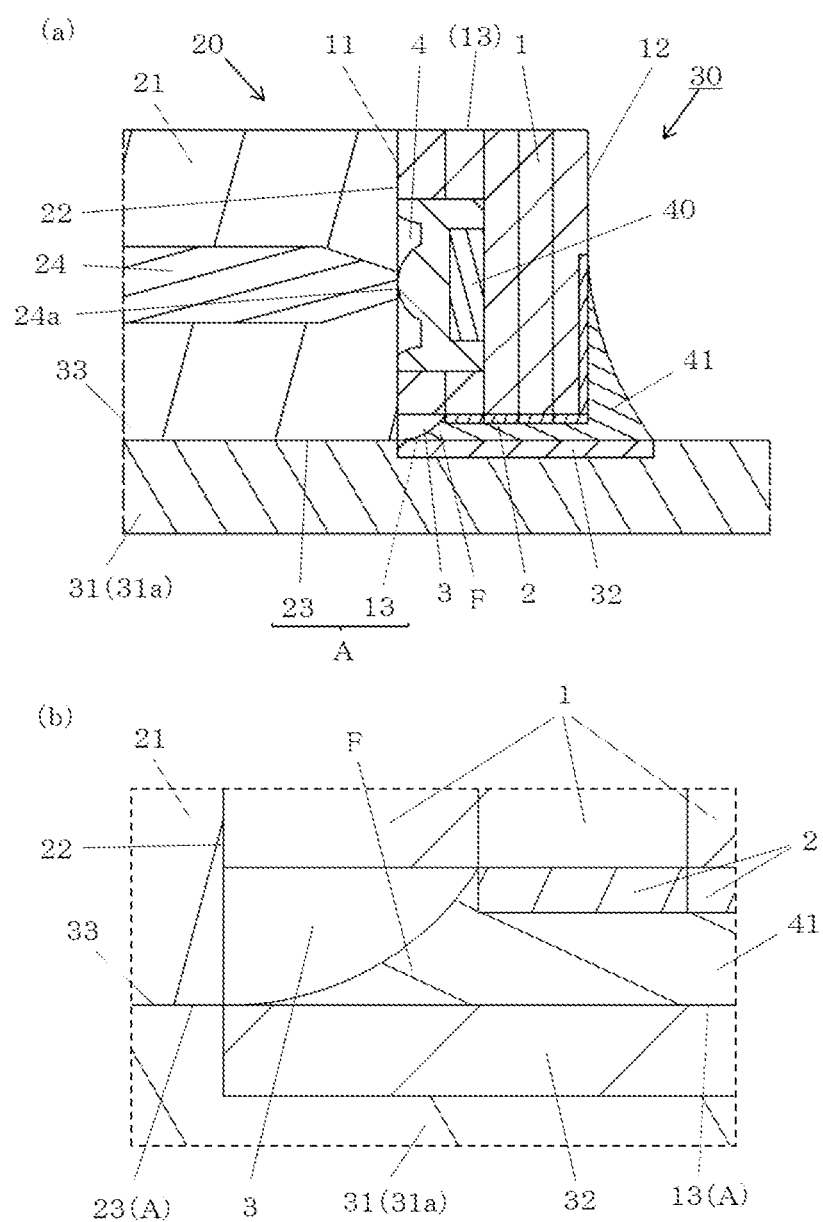
FIG. 1(a) is a sectional view of an electronic module according to a first embodiment of the present invention.
FIG. 1(b) is an enlarged view of an important part of FIG. 1(a).

Electronic modules according to embodiments of the present invention will be described with reference to the accompanying drawings. FIG. 1(a) is a sectional view of an electronic module according to a first embodiment of the present invention, and FIG. 1(b) is an enlarged view of an important part of FIG. 1(a). FIG. 2(a) is a perspective view of the electronic module illustrated in FIG. 1, and FIG. 2(b) is an enlarged view of an important part of FIG. 2(a). FIG. 3(a) is a plan view of an insulating substrate and mounting electrodes of the electronic module illustrated in FIG. 1, viewed from a location near a first principal surface, and FIG. 3(b) is a perspective view of FIG. 3(a).

An electronic device 20 is formed by joining a first principal surface 11 of an insulating substrate 1 on which a light emitting-receiving device 40 is mounted and an end surface 22 of a joining body 21 including a transmission line (described below) for a signal for the light emitting-receiving device 40. Mounting electrodes 2 for an external connection are provided on the insulating substrate 1. An electronic module 30 is formed by mounting the electronic device 20 on a circuit board 31 and electrically connecting the mounting electrodes 2 to connecting circuit portions 32 of the circuit board 31. For example, an optical signal that is transmitted to and from the electronic device 20 through an optical transmission path 24, which serves as the transmission line for the signal, is processed (subjected to photoelectric conversion) by the light emitting-receiving device 40. An electric signal generated as a result of processing the optical signal is transmitted between the electronic device 20 and the circuit board 31. FIG. 1(a) illustrates an example in which the light emitting-receiving device 40 is sealed in a transparent resin formed in the shape of a lens so that the optical signal can be appropriately transmitted between the light emitting-receiving device 40 and the optical transmission path 24.

The insulating substrate 1 includes a side surface 13 having grooves 3. The grooves 3 extend in a thickness direction of the insulating substrate 1 (direction perpendicular to the first principal surface 11). The mounting electrodes 2 are disposed in the grooves 3. FIG. 1 shows sectional views at a location of one of the grooves 3 where the side surface 13 does not exist. Therefore, the position of the side surface 13 is indicated by the dashed leader line.

A recess 4 is formed in the first principal surface 11 of the insulating substrate 1. The light emitting-receiving device 40 is fixed to the bottom surface of the recess 4 with a solder material or the like. The first principal surface 11 faces upward when the light emitting-receiving device 40 is placed in the recess 4. At this time, the first principal surface 11 can be regarded as a top surface that is perpendicular to the side surface 13. Namely, the insulating substrate 1 on which the light emitting-receiving device 40 is mounted is used for side-surface mounting.

The joining body 21 includes the transmission line for the optical signal (optical transmission path 24), and has a function of positioning the optical transmission path 24 with respect to the light emitting-receiving device 40. The optical transmission path 24 is, for example, an optical fiber, and extends from the end surface 22 of the joining body 21 in a direction away from the light emitting-receiving device 40. In this case, for example, one end of the optical fiber is located at the end surface 22 of the joining body 21, and the opposite end of the optical fiber is optically connected to an optical element mounted on an external electronic apparatus. Thus, an optical signal can be transmitted between, for example, the external electronic apparatus and the light emitting-receiving device 40.

More specifically, the joining body 21 includes the end surface 22 at which an end portion 24a of the optical transmission path 24, which extends through the joining body 21, is disposed and a side surface 23 that is perpendicular to the end surface 22. The end surface 22 faces the first principal surface 11 of the insulating substrate 1 and is joined to the first principal surface 11 while the end portion 24a of the optical transmission path 24 is positioned with respect to the light emitting-receiving device 40. The side surface of the joining body 21 and the side surface 13 of the insulating substrate 1 are continuous to each other and define a single side surface A.

As described above, in the electronic device 20, the side surface 13 of the insulating substrate 1 and the side surface 23 of the joining body 21 are connected to each other and define a single flat surface (single side surface A). This single side surface A faces the circuit board 31 when the electronic device 20 is mounted on the circuit board 31 as described below.

The circuit board 31 transmits, for example, signals including electric signals between the electronic device 20 and various electronic components (not shown) mounted on the circuit board 31. The electronic components include active elements that perform various processes such as arithmetic and storage processes. The circuit board 31 includes an electrically insulating board body 31a and connecting circuit portions 32 disposed on one of the principal surfaces (outer principal surface) 33 of the board body 31a that faces the electronic device 20.

The electronic module 30, in which the electronic device 20 is mounted on the circuit board 31, is obtained by arranging the single side surface A of the electronic device 20 and the outer principal surface 33 of the circuit board 31 so as to face each other and electrically connecting the mounting electrodes 2 to the connecting circuit portions 32.

The mounting electrodes 2 are electrically connected to the connecting circuit portions 32 by joining the mounting electrodes 2 to the connecting circuit portions 32 with a conductive joining material 41, such as solder. In the electronic module 30, an end portion of each mounting electrode 2 near the joining body 21 is located further toward the insulating substrate 1 than an end portion of the corresponding groove 3 near the joining body 21. More specifically, when viewed in the direction perpendicular to the single side surface A, an end of a portion of each mounting electrode 2 to which the joining material 41 is joined and an end of a portion of the corresponding connecting circuit portion 32 to which the joining material 41 is joined are shifted from each other. The direction of this shift is the direction in which the mounting electrode 2 and the end surface 22 of the joining body 21 are spaced from each other in the corresponding groove 3. A space (not denoted by any reference numeral) is provided between the mounting electrode 2 and the end surface 22 of the joining body 21 in the groove 3. A fillet F of the joining material 41 is formed in a section of the groove 3 near the joining body 21. In other words, in the electronic module 30 according to the embodiment, the groove 3 includes a space that enables formation of the fillet F of the joining material 41.

In the electronic module 30 according to the embodiment, the thermal stress is reduced at the end portion of the joining material 41 because the joining material 41 includes the fillet F as described above. Therefore, the reliability of connection between the mounting electrodes 2 and the connecting circuit portions 32 is increased. Thus, the electronic module 30 in which the reliability of connection between the electronic device 20 and the circuit board 31, for example, can be increased can be provided.

The electronic module 30 can be regarded as, for example, a photoelectric conversion member (photoelectric conversion module) in which the light emitting-receiving device 40 performs photoelectric conversion between the optical signal transmitted through the optical transmission path 24 in the joining body 21 and the electric signal transmitted through the connecting circuit portions 32. In this case, the light emitting-receiving device 40 may be, for example, a light receiving element or a light emitting element. The light receiving element is a conversion element that converts an optical signal into an electric signal, such as a photodiode. The light emitting element is a conversion element that converts an electric signal into an optical signal, such as a semiconductor laser, for example, a vertical cavity surface emitting laser (VCSEL), or a light emitting diode.

The optical transmission path 24 in the joining body 21 transmits an optical signal, and is formed of a central portion (core) made of a material having a high refractive index and a coating portion (cladding) made of a material having a low refractive index. Light incident on the core propagates through the core while being totally reflected at the boundary between the core and the cladding. More specifically, the optical transmission path 24 is, for example, an optical fiber or an optical waveguide. The optical waveguide is a plate-shaped or sheet-shaped flat optical transmission path manufactured by forming a core made of quartz or polymer on a substrate and forming a cladding around the core. The main body of the joining body 21 (not denoted by any reference numeral) functions as a holding member (optical connector) that holds the optical transmission path 24, such as an optical fiber or an optical waveguide, and that secures and positions the optical transmission path 24 with respect to the light emitting-receiving device 40 mounted on the insulating substrate 1. When optical wiring is employed, light needs to be propagated toward a desired location since the light has directivity. Therefore, a positioning guide pin or a microlens may be mounted in the optical connector (main body of the joining body 21). The light emitting-receiving device 40 is fixed to the bottom portion of the recess 4 in the first principal surface 11 of the insulating substrate 1. The optical transmission path 24 (in particular, the end portion 24a) is secured and positioned with respect to the light emitting-receiving device 40 by joining the end surface 22 of the joining body 21 (main body) to the first principal surface 11 of the insulating substrate 1. The end surface 22 of the joining body 21 (main body) and the first principal surface 11 of the insulating substrate 1 are joined together by using, for example, an adhesive such as an epoxy resin. When the joining body 21 includes a guide pin or the like, the positioning accuracy can be increased by forming a guide hole that extends from the first principal surface 11 to the second principal surface 12 of the insulating substrate 1.

An example of a method for manufacturing the electronic module 30 will now be described.

The insulating substrate 1 is formed of, for example, a ceramic material such as a glass ceramic sintered body, an aluminum oxide sintered body, a mullite sintered body, an aluminum nitride sintered body, or a silicon nitride sintered body, or a resin material such as an epoxy resin.

In the example illustrated in FIG. 1, the insulating substrate 1 is formed by stacking a plurality of insulating layers (not denoted by any reference numeral) made of a ceramic material together. When each of the insulating layers is made of, for example, a glass ceramic sintered body, the insulating substrate 1 is formed by the following processes. First, ceramic green sheets are prepared by forming glass powder and ceramic powder, which are materials of, for example, silicon oxide and aluminum oxide, into the shape of sheets together with an organic solvent and binder. Next, a multi-layer body obtained by stacking the ceramic green sheets together is fired at a temperature of about 900° C. to 1000° C. The insulating substrate 1, which is formed of a glass ceramic sintered body, can be manufactured by the above-described processes.

In the above-described processes, some of the ceramic green sheets are subjected to punching and formed into frame-shaped sheets. The insulating substrate 1 including the recess 4 is formed by stacking the frame-shaped sheets onto the other ceramic green sheets.

The grooves 3 are formed by, for example, performing a firing process after performing a mechanical punching or cutting process on portions of the ceramic green sheets of the insulating substrate 1 that form the single side surface A or on a portion of the multilayer body of the ceramic green sheets that forms the single side surface A. A plurality of the insulating substrates 1 may be manufactured together by forming a multi-piece board (not shown) in which substrate regions that become the insulating substrates 1 are arranged on a mother board. In this case, the grooves 3 can be formed by forming through holes at the boundaries between the substrate regions. More specifically, the through holes at the boundaries between the substrate regions remain 1 as the grooves 3 at the side surface 13 of each insulating substrate after the mother board is divided. The through holes can be formed by, for example, subjecting the mother board to a mechanical punching process using a die or a laser machining process before the firing process.

The mounting electrodes 2 are made of a metal material such as copper, silver, palladium, gold, platinum, tungsten, molybdenum, nickel, or cobalt. The mounting electrodes 2 may instead be made of an alloy containing one or more of the metal materials as main components. The inner surfaces of the grooves 3 in the insulating substrate 1 may be coated with these metal materials by, for example, a metallizing method, a plating method, or a vapor deposition method.

When the mounting electrodes 2 are made of copper applied to the insulating substrate 1 by a metallizing method, the mounting electrodes 2 may be formed by the following processes. First, metal paste produced by kneading copper powder together with, for example, an organic solvent and a binder is prepared. Next, the metal paste is applied to the inner surfaces of the grooves 3 in the ceramic green sheets of the insulating substrate 1 in a predetermined pattern by, for example, screen printing. Subsequently, these materials are fired together to form the mounting electrodes 2 on the insulating substrate 1. In the example illustrated in FIG. 1, it is not necessary to apply the metal paste in a region close to the first principal surface 11 of the insulating substrate 1. Therefore, the risk that the metal paste will be applied to the first principal surface 11 of the insulating substrate 1 is reduced. Accordingly, the flatness of the first principal surface 11 of the insulating substrate 1 can be increased, and the first principal surface 11 of the insulating substrate 1 and the end surface 22 of the joining body 21 can be reliably joined to each other.

Wiring conductors (not shown) that electrically connect the light emitting-receiving device 40 to the mounting electrodes 2 are formed in the insulating substrate 1. The wiring conductors extend from, for example, the bottom surface of the recess 4 to the side surface 13 through the insulating substrate 1. Portions of the wiring conductors disposed at the bottom surface of the recess 4 function as connection pads for the light emitting-receiving device 40. The pads are electrically connected to the light emitting-receiving device 40 by conductive connecting members (not shown), such as bonding wires or solder bumps. Portions of the wiring conductors disposed at the side surface 13 of the insulating substrate 1 are directly connected to the mounting electrodes 2. Thus, the light emitting-receiving device 40 is electrically connected to the mounting electrodes 2.

The wiring conductors may be formed by a method similar to that for forming the mounting electrodes 2 by using a metal material similar to that of the mounting electrodes 2. Portions of the mounting electrodes 2 and the wiring conductors exposed at the outer surface of the insulating substrate 1 may be coated with a plating layer such as a nickel plating layer or a gold plating layer. The plating layer may be formed on the above-described exposed portions by a plating method, such as an electroplating method, before the light emitting-receiving device 40 is stored and fixed in the insulating substrate 1.

The light emitting-receiving device 40 is mounted on the insulating substrate 1 that has been manufactured as described above by, for example, fixing the light emitting-receiving device 40 to the bottom surface of the recess 4 with a solder material or a thermally conductive resin (not shown) as described above. For example, first, the light emitting-receiving device 40 is positioned on the bottom surface of the recess 4 by using solder paste, sheet, or the like. Then, the light emitting-receiving device 40 can be fixed to the bottom surface of the recess 4 by temporarily melting the solder material and then cooling and solidifying the solder material. The light emitting-receiving device 40 is mounted by electrically connecting the light emitting-receiving device 40 to, for example, the wiring conductors with the conductive connecting members as described above.

The insulating substrate 1 on which the light emitting-receiving device 40 is mounted can be joined to the joining body 21 by, for example, the above-described method using the above-described material (for example, by using an adhesive). The electronic device 20 can thus be manufactured.

The circuit board 31 is a printed board formed of a plate-shaped material (board body 31a), obtained by impregnating glass fiber cloth with an epoxy resin and performing a thermosetting process, and a copper foil or the like that forms a circuit conductor of, for example, the connecting circuit portions 32 (entirety of the circuit conductor is not shown).

The joining material 41 is a material such as solder as described above, and may be, for example, tin-silver solder, tin-silver-copper solder, or tin-lead solder (so-called eutectic solder). The joining material 41 is not limited to solder, and may instead be other conductive joining materials such as a conductive adhesive or an anisotropic conductive adhesive.

When, for example, solder is used as the joining material 41, the electronic device 20 is mounted on the circuit board 31 by the following method. First, the mounting electrodes 2 of the electronic device 20 and the connecting circuit portions 32 of the circuit board 31 are positioned so as to face each other with solder paste interposed therebetween. Subsequently, the solder paste is heated and melted, and then cooled and solidified. Thus, the electronic device 20 can be mounted. Due to a surface tension generated when the joining material 41 is melted, the fillet F is formed in the joining material 41 in a molten state over a region from an end portion of each connecting circuit portion 32 near the joining body 21 to an end portion of the corresponding mounting electrode 2 near the joining body 21. In other words, since the above-described space is provided in each groove 3, the fillet F can be easily formed at the end portion of the joining material 41 in a molten state near the joining body 21.

In this embodiment, the grooves 3 are formed only in the side surface 13 of the insulating substrate 1 in the single side surface A of the electronic device 20. In other words, no grooves 3 are formed in the side surface 23 of the joining body 21 in the single side surface A of the electronic device 20. In this case, only the side surface 13 of the insulating substrate 1 needs to be subjected to the process for forming the grooves 3. Therefore, the productivity of the electronic device 20 can be increased.

In addition, in this embodiment, the grooves 3 are formed in the side surface 13 of the insulating substrate 1 over the entire length of the insulating substrate 1 in the thickness direction. In this case, the area in which each mounting electrode 2 is joined with the joining material 41 is sufficiently large. Therefore, the strength with which each mounting electrode 2 is joined to the corresponding connecting circuit portion 32 by the joining material 41 can be increased, and the mounting reliability can be increased accordingly.

In addition, in this embodiment, the insulating substrate includes the first principal surface 11 and the second principal surface 12 that oppose each other, and the mounting electrodes 2 extend to the second principal surface 12. In this case, the area in which each mounting electrode 2 is joined with the joining material 41 can be further increased, and the strength with which each mounting electrode 2 is joined to the corresponding connecting circuit portion 32 by the joining material 41 can be further increased. Accordingly, the reliability of connection between the electronic device 20 and the circuit board 31 can be further increased.

Figure 3:
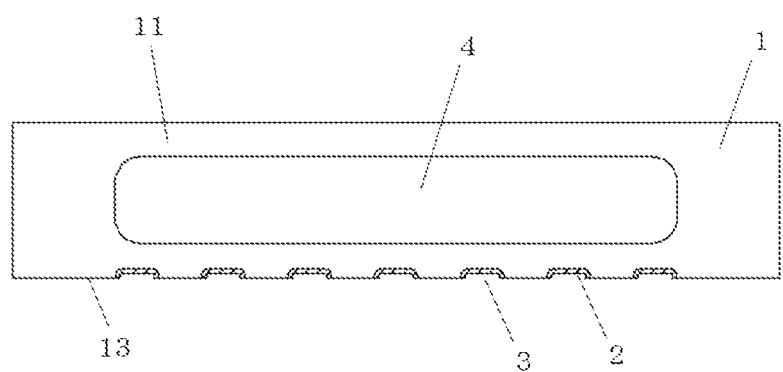
FIG. 3(a) is a plan view of an insulating substrate and mounting electrodes of the electronic module illustrated in FIG. 1, viewed from a location near a first principal surface.
FIG. 3(b) is a perspective view of FIG. 3(a).
Figure 3:
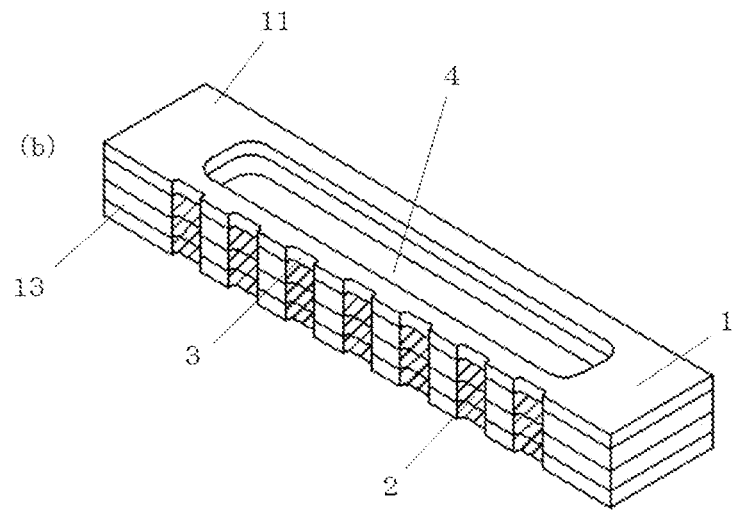
Figure 4:
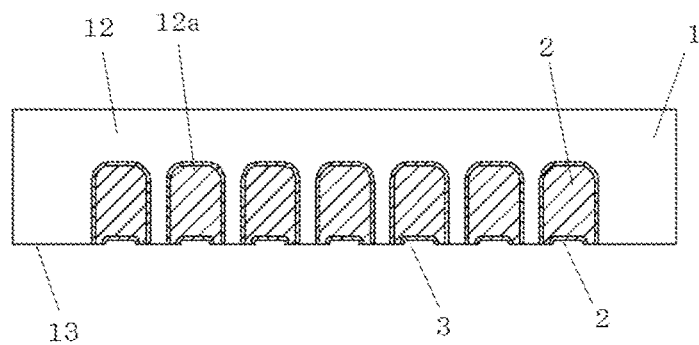
FIG. 4(a) is a plan view of an insulating substrate according to a modification of FIG. 3, viewed from a location near a second principal surface.
FIG. 4(b) is a perspective view of FIG. 4(a).
Figure 4:
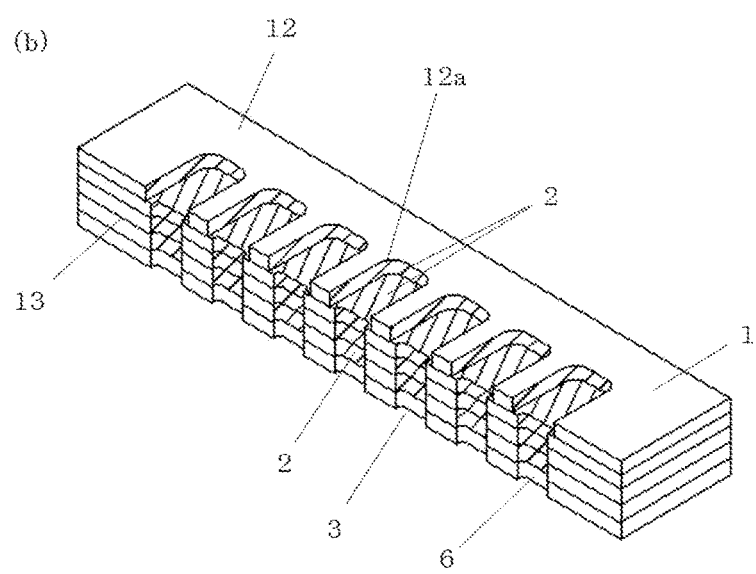
Figure 5:
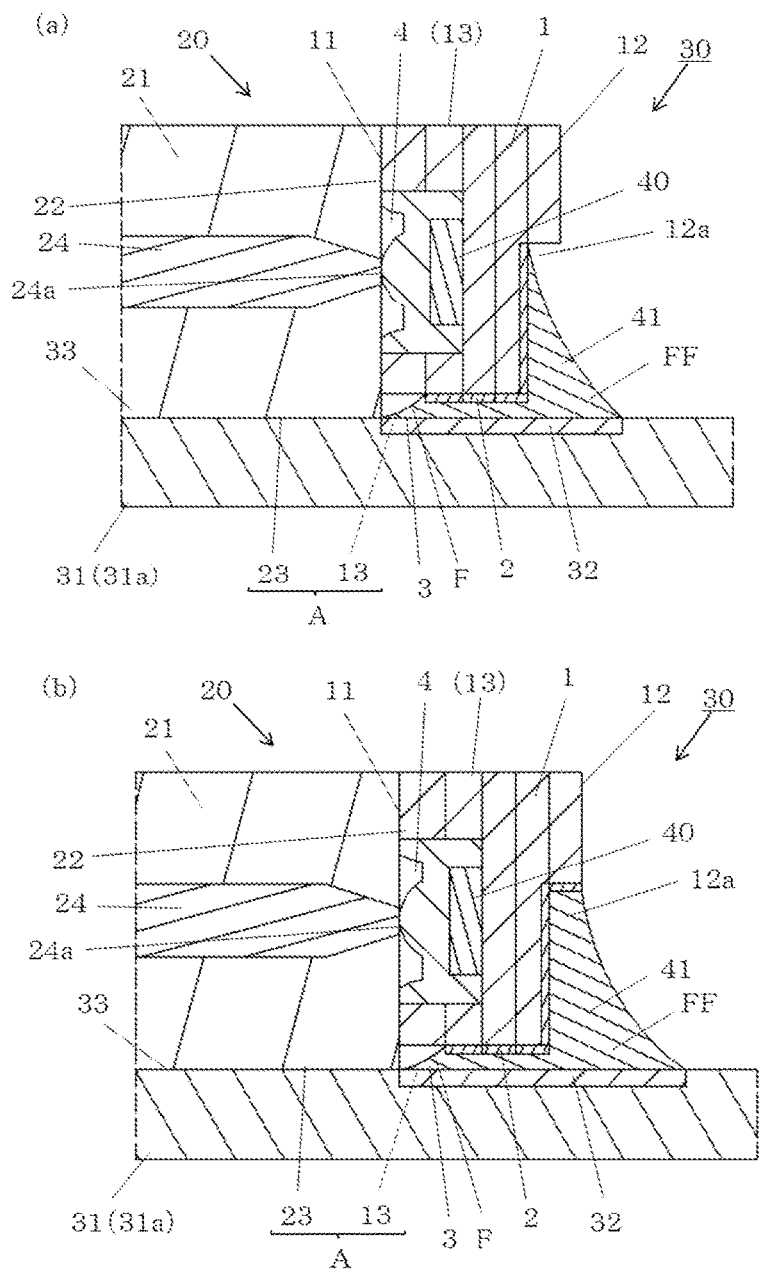
FIG. 5(a) is a sectional view of a modification of the electronic module illustrated in FIG. 1.
FIG. 5(b) is a sectional view of another modification.

FIG. 4(a) is a plan view of an insulating substrate 1 according to a modification of FIG. 3, viewed from a location near a second principal surface 12, and FIG. 4(b) is a perspective view of FIG. 4(a). FIG. 5(a) is a sectional view of a modification of the electronic module 30 illustrated in FIG. 1, and FIG. 5(b) is a sectional view of another modification. In other words, FIGS. 4 and 5 illustrate modifications of the electronic module 30 according to the first embodiment. Surfaces of step portions 12a of the insulating substrate 1 are portions of the second principal surface 12, and each step portion 12a includes a bottom surface that is perpendicular to the side surface of the insulating substrate 1 and a side surface that is perpendicular to the bottom surface.

In each of the examples illustrated in FIGS. 4 and 5, the second principal surface 12 of the insulating substrate 1 includes the step portions 12a, which have a recessed shape, in a peripheral portion thereof near the single side surface A. An end portion of each groove 3 near the second principal surface 12 is disposed in the corresponding step portion 12a.

In these modifications, at least a portion of each mounting electrode 2 that extends to the second principal surface 12 is disposed in the corresponding step portion 12a. In other words, an inner surface of the step portion 12a (portion of the second principal surface 12) is covered with the mounting electrode 2. Therefore, the joining area between a portion of the mounting electrode 2 that extends to the second principal surface 12 and the joining material 41 can be easily increased by, for example, an amount corresponding to the area of the side surface of the step portion 12a. Thus, this configuration is advantageous in that, for example, the joining area between the joining material 41 and the mounting electrode 2 can be increased. In addition, a fillet FF can be easily formed in the joining material 41 at the step portion 12a. Accordingly, the electronic module 30 in which the reliability of connection between the electronic device 20 and the circuit board 31 can be further increased can be provided.

Each mounting electrode 2 may extend so as to cover the entire area of the second principal surface 12 in the step portion 12a, as in the example illustrated in FIG. 5(b). In other words, the entire surface of the step portion 12a may be covered with the mounting electrode 2. Accordingly, the joining area between the joining material 41 and the mounting electrode can be easily increased. Thus, the electronic module 30 in which the reliability of connection between the electronic device 20 and the circuit board 31 can be further increased can be provided.

In the examples illustrated in FIGS. 4 and 5, multiple grooves 3 are formed in the single side surface A. In addition, multiple step portions 12a are disposed in the second principal surface 12. The step portions 12a are in one-to-one correspondence with the grooves 3. In this case, an amount of reduction in the mechanical strength of the insulating substrate 1 in a region near the second principal surface 12 due to the step portions 12a can be reduced.

In addition, in this case, spreading of the joining material 41 joined to the mounting electrodes 2 over the second principal surface 12 is suppressed due to the step portions 12a. Therefore, the risk of short-circuiting between the adjacent mounting electrodes 2 due to spreading of the joining material 41 is effectively reduced.

The step portions 12a can be formed by, for example, the following method. That is, when the grooves 3 are formed by, for example, punching the ceramic green sheets of the insulating substrate 1, the punching dimensions of some of the ceramic green sheets are set to be greater than those of the remaining ceramic green sheets. The ceramic green sheets with the greater punching dimensions are stacked in a region near the second principal surface, and are fired. Thus, the insulating substrate 1 including the step portions 12a is obtained. In this case, when viewed from a location near the second principal surface 12, the step portions 12a can be regarded as portions of the grooves 3 that are larger in dimensions than the other portions.

When multiple grooves 3 are formed in the single side surface A, the step portions may be arranged such that each step portion corresponds to two or more grooves 3 from the viewpoint of design, such as the arrangement of the above-described wiring conductors, or in consideration of the productivity, economic efficiency, etc., of the insulating substrate 1. In other words, end portions of multiple grooves 3 may be disposed in a single step portion (not shown). In this case, the end portions of all of the grooves 3 may be disposed in a single step portion (not shown).

Figure 2:
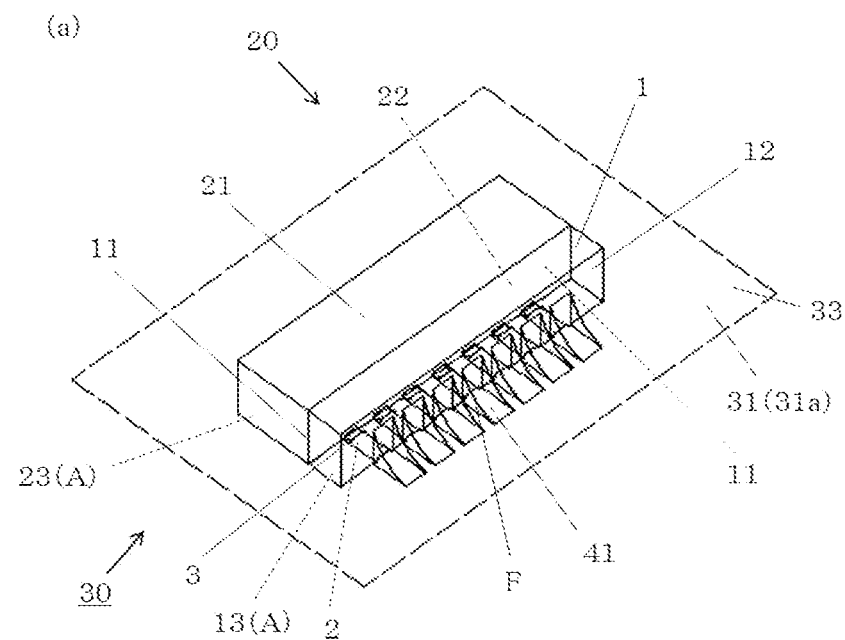
FIG. 2(a) is a perspective view of the electronic module illustrated in FIG. 1.
FIG. 2(b) is an enlarged view of an important part of FIG. 2(a).
Figure 2:
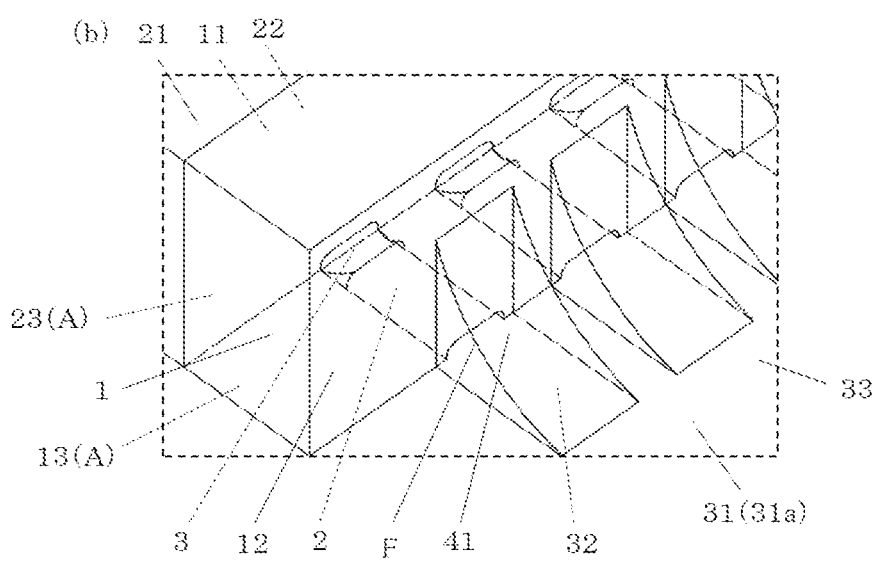
Figure 6:
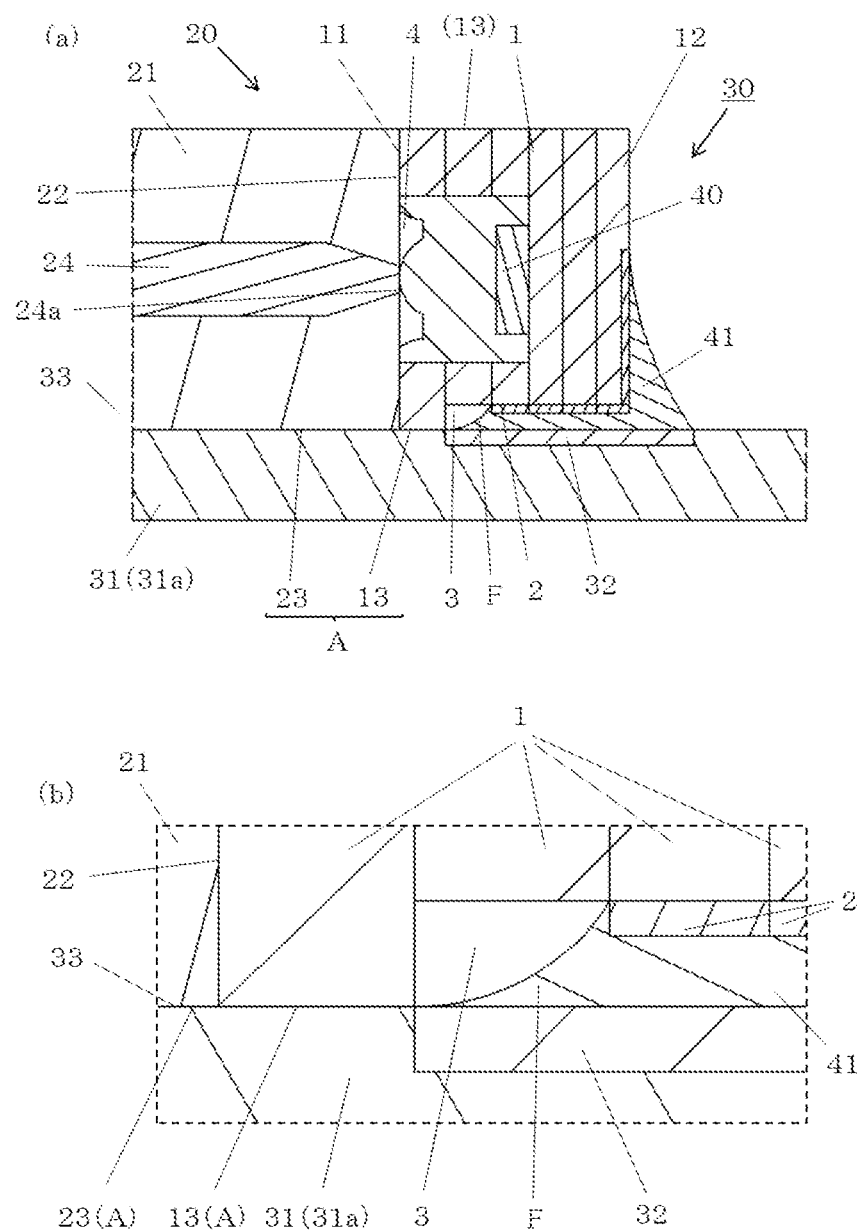
FIG. 6(a) is a sectional view of an electronic module according to a second embodiment of the present invention.
FIG. 6(b) is an enlarged view of an important part of FIG. 6(a).

FIG. 6(a) is a sectional view of an electronic module 30 according to a second embodiment of the present invention, and FIG. 6(b) is an enlarged view of an important part of FIG. 6(a). In FIG. 6, components similar to, or the same as, those in FIGS. 1 to 3 are denoted by the same reference numerals. In the electronic module 30 according to the second embodiment, the grooves 3 are formed in the side surface 13 of the insulating substrate 1 so as to extend partially in the thickness direction. More specifically, each groove 3 extends along the side surface 13 of the insulating substrate 1 to the second principal surface 12, but not to the first principal surface 11. In other respects, the electronic module 30 according to the second embodiment is similar to the module 30 according to the first embodiment. Description of similar points is omitted.

In the second embodiment, the mechanical strength of an end portion of the side surface 13 of the insulating substrate 1 near the first principal surface 11 can be easily increased. Therefore, the mechanical strength of the insulating substrate 1 increases over, for example, the entire area in which the first principal surface 11 of the insulating substrate 1 is joined to the end surface 22 of the joining body 21. In this case, the risk of mechanical breakage, such as cracks, of the insulating substrate 1 due to stress, such as thermal stress, at the joining boundary can be effectively reduced. In addition, the joining area between the first principal surface 11 of the insulating substrate 1 and the joining body 21 can be increased. Therefore, the strength with which the insulating substrate 1 and the joining body 21 are joined together can be increased. Accordingly, the risk that the joining body 21 will be partially separated from the insulating substrate 1 and the optical axis will be displaced, for example, can be suppressed.

FIG. 7(a) is a sectional view of an electronic module 30 according to a third embodiment of the present invention, and FIG. 7(b) is an enlarged view of an important part of FIG. 7(a). In the third embodiment, an auxiliary mounting electrode 2a is disposed on an inner surface of each groove 3. The auxiliary mounting electrode 2a is apart from the corresponding mounting electrode 2 in the thickness direction. An auxiliary connecting circuit portion 32a is disposed on the outer principal surface of the circuit board 31 so as to face the corresponding auxiliary mounting electrode 2a. The auxiliary mounting electrode 2a and the auxiliary connecting circuit portion 32a are connected to each other with an auxiliary joining material 42 in the groove 3. A fillet F of the auxiliary joining material 42 is formed between the mounting electrode 2 and the auxiliary mounting electrode 2a, which are apart from each other. In other respects, the electronic module 30 according to the third embodiment is similar to the module 30 according to the first embodiment. Description of similar points is omitted.

The electronic module 30 according to the third embodiment can be regarded as an example in which each mounting electrode 2 and the corresponding connecting circuit portion 32 are each divided into multiple parts that are apart from each other. It can also be regarded as an example in which each mounting electrode 2 and the corresponding connecting circuit portion 32 are joined at multiple points in the corresponding groove 3.

The auxiliary mounting electrode 2a and the auxiliary connecting circuit portion 32a may be arranged so as not to be connected to signal wires, such as the above-described wiring conductors (may be provided as so-called dummy electrodes). In this case, even when cracks are formed in the auxiliary joining material 42, the cracks do not extend to the joining material 41. Therefore, the electrical connection between the mounting electrode 2 and the connecting circuit portion 32 through the joining material 41 (that is, electrical connection between the electronic device 20 and the circuit board 31) is maintained, and the function of the electronic module 30 can be maintained accordingly. In addition, since the fillet F is formed also in the auxiliary joining material 42, the stress applied to the auxiliary joining material 42 can be reduced and the risk of breakage, such as cracks, can be reduced accordingly. Therefore, the reliability of connection between the electronic device 20 and the circuit board 31 can be further increased.

Figure 8:
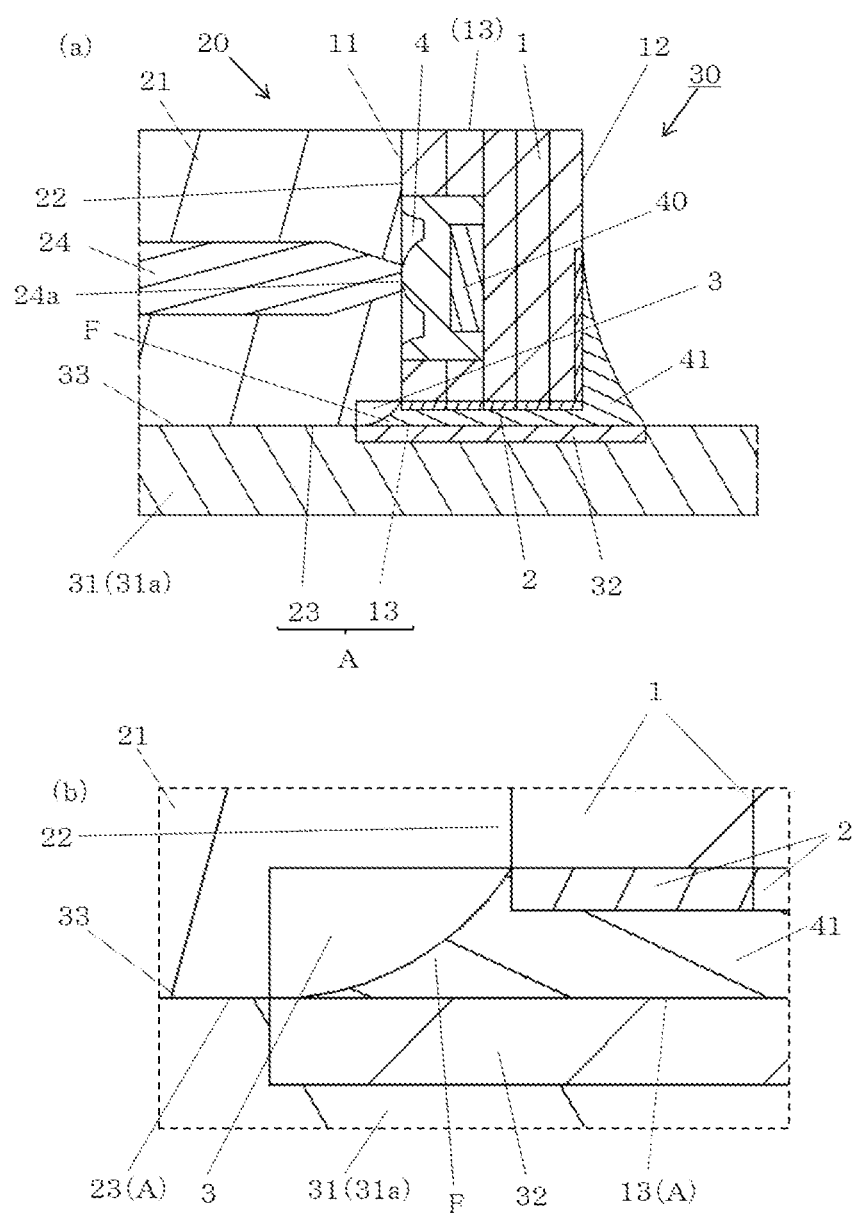
FIG. 8(a) is a sectional view of an electronic module according to a fourth embodiment of the present invention.
FIG. 8(b) is an enlarged view of an important part of FIG. 8(a).

FIG. 8(a) is a sectional view of an electronic module 30 according to a fourth embodiment of the present invention, and FIG. 8(b) is an enlarged view of an important part of FIG. 8(a). In the fourth embodiment, each groove 3 extends along the side surface 13 of the insulating substrate 1 and the side surface 23 of the joining body 21. The mounting electrode 2 is not disposed in the portion of the groove 3 in the side surface 23 of the joining body 21. The mounting electrode 2 extends over the entire length of the side surface 13 of the insulating substrate 1 in the direction in which the groove 3 extends. In other respects, the electronic module 30 according to the fourth embodiment is similar to the module 30 according to the first embodiment. Description of similar points is omitted.

In the electronic module 30 according to the fourth embodiment, the mounting electrode 2 extends over a larger area on the inner surface of the groove 3, and a space for forming the fillet F can be easily provided in the end portion of the groove 3 in the joining body 21. Therefore, the electronic device 20 and the circuit board 31 can be joined together by using a larger amount of joining material 41, and the bonding strength can be increased. Also in this case, the reliability of connection between the electronic device 20 and the circuit board 31 can be further increased.

Figure 7:
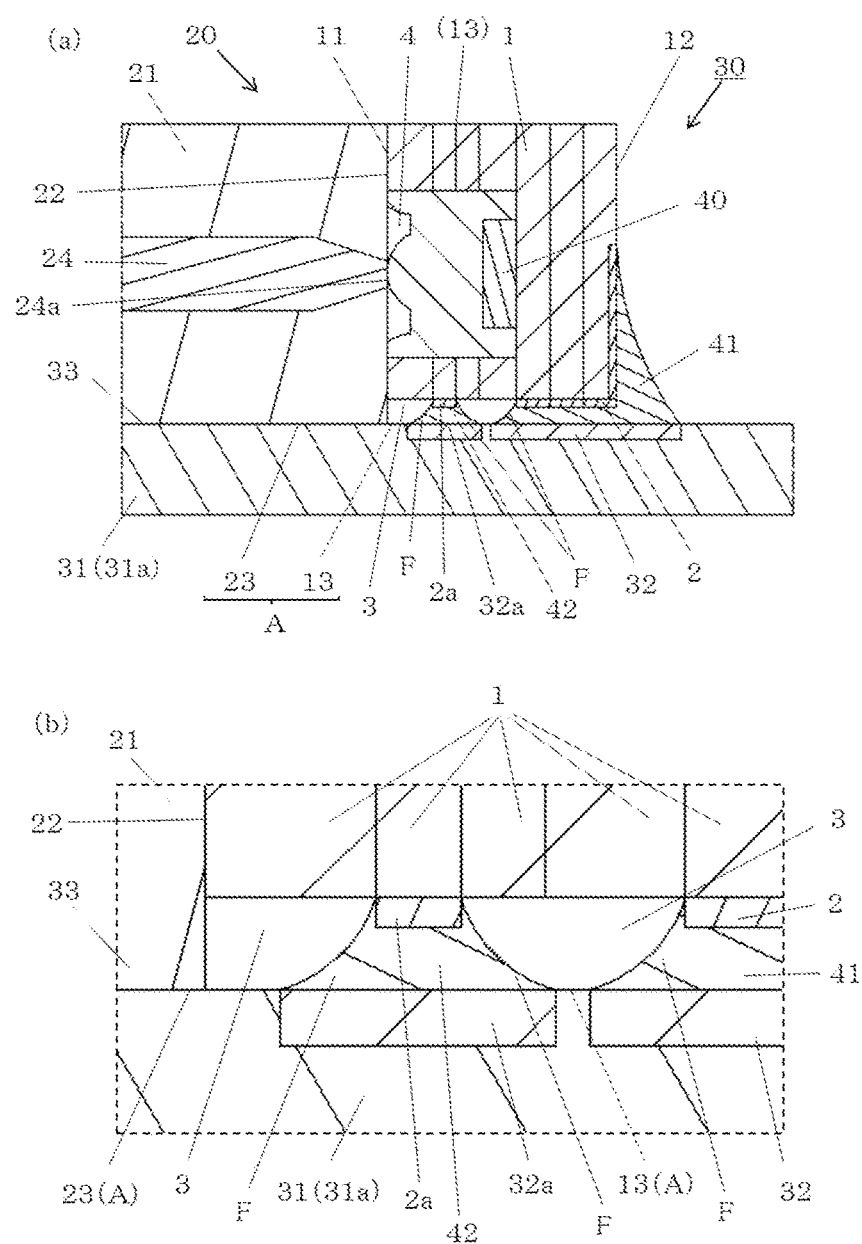
FIG. 7(a) is a sectional view of an electronic module according to a third embodiment of the present invention.
FIG. 7(b) is an enlarged view of an important part of FIG. 7(a).
Figure 9:
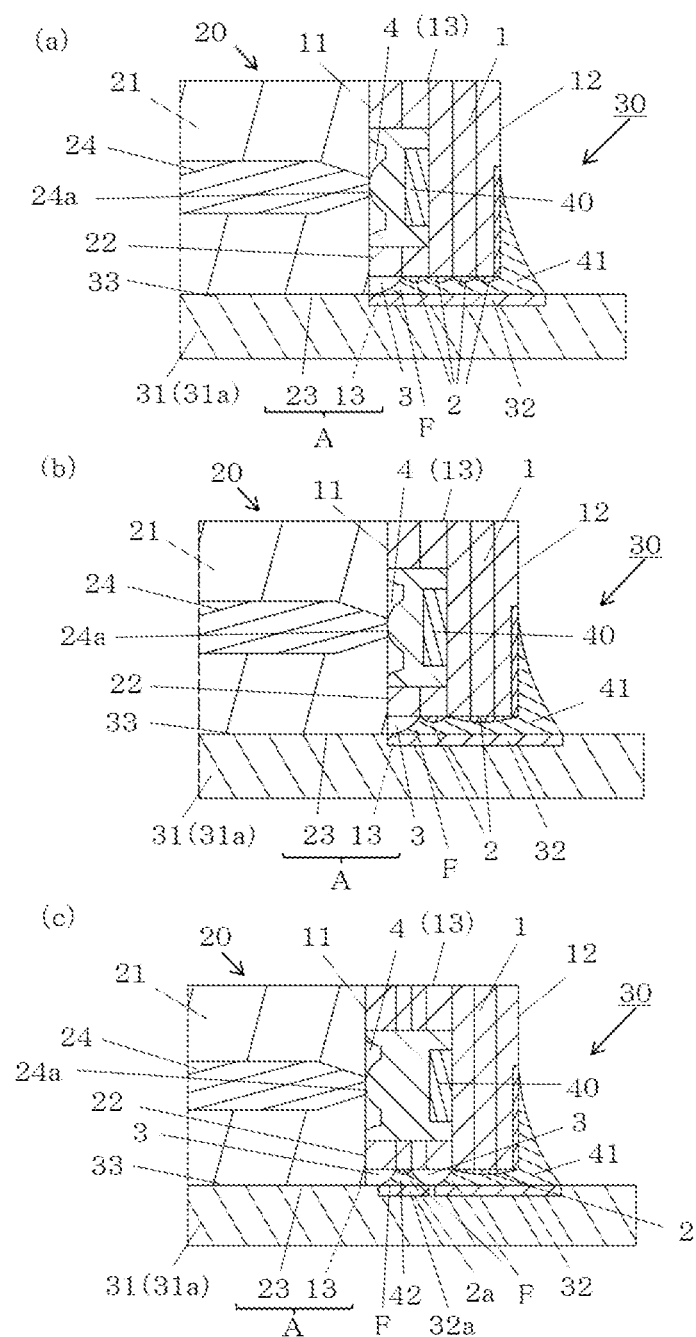
FIGS. 9(a) and 9(b) are sectional views of modifications of the electronic module illustrated in FIG. 1.
FIG. 9(c) is a sectional view of a modification of the electronic module illustrated in FIG. 7.

FIGS. 9(a) and 9(b) are sectional views of modifications of the electronic module 30 illustrated in FIG. 1, and FIG. 9(c) is a sectional view of a modification of the electronic module 30 illustrated in FIG. 7. In these modifications, the shape of each mounting electrode 2 differs from those in the examples illustrated in FIGS. 1 and 7. In other respects, the modifications are similar to the modules 30 according to the embodiments. Description of similar points is omitted.

In these modifications, the thickness of a portion of each mounting electrode 2 in a direction parallel to the first principal surface 11 of the insulating substrate 1 differs from that of other portions. In the example illustrated in FIG. 9(a), the mounting electrode 2 is formed so that the thickness thereof is large in the central region of each insulating layer and small at the ends of each insulating layer. In the example illustrated in FIG. 9(b), the mounting electrode 2 is formed so that the thickness thereof is large in the central region of each of a group of insulating layers in which the recess 4 is formed and a group of the remaining insulating layers (each of the multilayer bodies obtained by stacking the insulating layers), and small at the ends of each group of insulating layers. In the example illustrated in FIG. 9(c), the mounting electrode 2 and the auxiliary mounting electrode 2a are each formed so that the thickness thereof is large in the central region thereof and small at the ends thereof.

When each mounting electrode 2 (and each auxiliary mounting electrode 2a as necessary) is formed as described above, the height of the fillet F in sectional view can be easily increased. In addition, the contact area between the joining material 41 and the mounting electrode 2 can be increased. Therefore, in the electronic module 30, the strength with which the electronic device 20 and the circuit board 31 are joined together can be further increased.

In addition, since the boundary between the joining material 41 and the mounting electrode 2 is not disposed on a single plane, the resistance against the shear stress can be increased. A similar effect can be obtained by modifications other than those illustrated in FIG. 9 when the thickness of some insulating layers differs from that of other insulating layers, for example, when the thickness of portions of the mounting electrode 2 and the auxiliary mounting electrode 2a is greater than that of other portions between the insulating layers. In these examples, if end portions of the mounting electrode 2 and the auxiliary mounting electrode 2a in the direction parallel to the first principal surface 11 are thinner than other portions, the fillet F is more easily deformed to reduce thermal stress.

Figure 10:
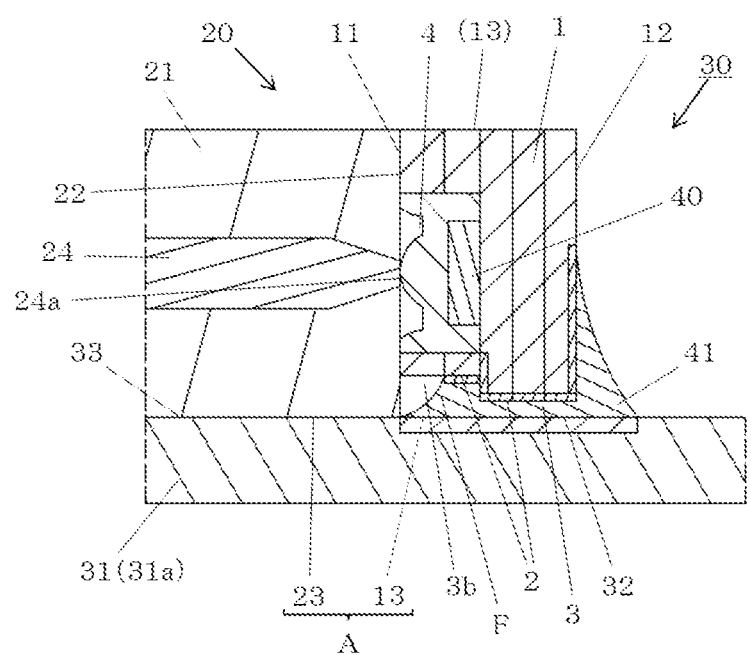
FIG. 10 is a sectional view of an electronic module according to a fifth embodiment of the present invention.
Figure 11:
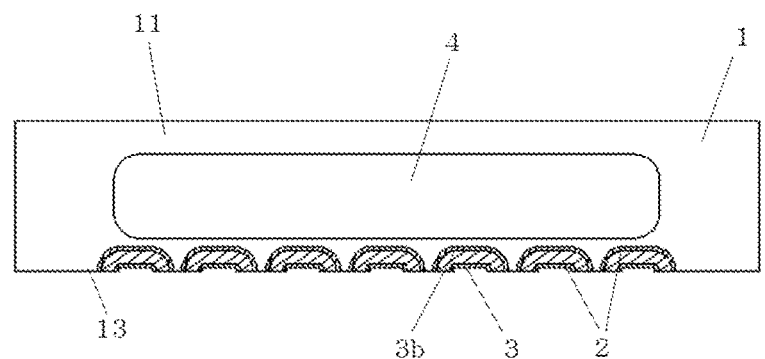
FIG. 11(a) is a plan view of an insulating substrate and mounting electrodes of the electronic module illustrated in FIG. 10, viewed from a location near a first principal surface.
FIG. 11(b) is a perspective view of FIG. 11(a).
Figure 11:
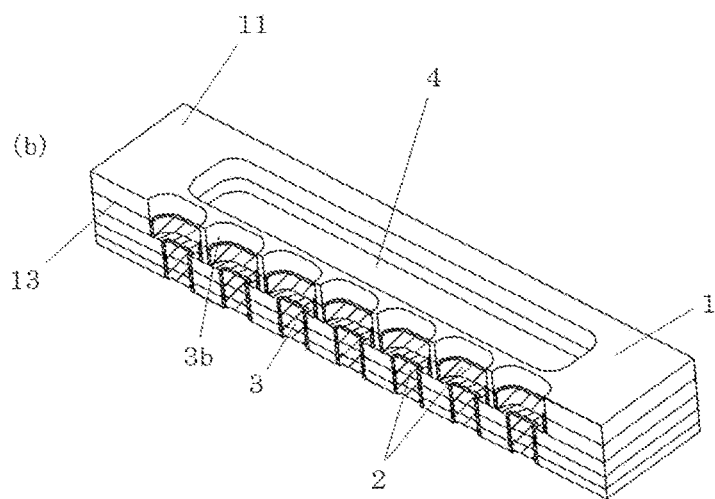

FIG. 10 is a sectional view of an electronic module 30 according to a fifth embodiment of the present invention. FIG. 11(a) is a plan view of an insulating substrate 1 and mounting electrodes 2 of the electronic module 30 illustrated in FIG. 10, viewed from a location near a first principal surface 11, and FIG. 11(b) is a perspective view of FIG. 11(a). In the fifth embodiment, when viewed from a location near the first principal surface 11 of the insulating substrate 1, an end portion 3b of each groove 3 near the joining body 21 is larger in area than other portions. More specifically, the depth of each groove 3b (depth into the insulating substrate 1) is large in a region near the joining body 21. The mounting electrodes 2 are disposed on portions of the inner surfaces of the grooves 3 (3b). In other respects, the electronic module 30 according to the fifth embodiment is similar to the module 30 according to the first embodiment. Description of similar points is omitted.

In the electronic module 30 according to the fifth embodiment, since the mounting electrodes 2 are formed in the above-described grooves 3 (3b), the joining area between the joining material 41 and the mounting electrodes 2 is greater than that in the electronic module 30 according to the first embodiment, and the height of the fillet F in the joining material 41 can be increased. Therefore, the reliability of connection between the electronic device 20 and the circuit board 31 can be increased.

The present invention is not limited to the above-described embodiments, and various modifications are possible within the gist of the present invention. For example, the shape and area of each groove 3 in the thickness direction that is perpendicular to the first principal surface 11 of the insulating substrate 1 may differ for each insulating layer of the insulating substrate 1.

REFERENCE SIGNS LIST 1 insulating substrate
2 mounting electrode
2a auxiliary mounting electrode
3 groove
4 recess
11 first principal surface
12 second principal surface
12a step portion
13 side surface (of insulating substrate)
20 electronic device
21 joining body
22 end surface
23 side surface (of joining body)
24 optical transmission path
24a end portion (of optical transmission path)
30 electronic module
31 circuit board
31a board body
32 connecting circuit portion
32a auxiliary connecting circuit portion
33 outer principal surface
40 light emitting-receiving device
41 joining material
42 auxiliary joining material
A side surface
F fillet
FF fillet (at step portion)

The invention claimed is:

1. An electronic module comprising:
an electronic device comprising
an insulating substrate comprising a first principal surface on which a light emitting-receiving device is mounted and a side surface perpendicular to the first principal surface,
a joining body comprising an end surface at which an end portion of an optical transmission path extending through the joining body is disposed and a side surface perpendicular to the end surface, the end surface facing the first principal surface of the insulating substrate and being joined to the first principal surface in a state in which the end portion of the optical transmission path is positioned with respect to the light emitting-receiving device, the side surface being continuous with the side surface of the insulating substrate and defining a single side surface together with the side surface of the insulating substrate, and
a mounting electrode disposed on an inner surface of a groove in the single side surface and extending in a thickness direction perpendicular to the first principal surface of the insulating substrate;

a circuit board comprising
a board body comprising an outer principal surface, and
a connecting circuit portion disposed on the outer principal surface of the board body; and
a joining material that connects the mounting electrode to the connecting circuit portion and mounts the electronic device on the circuit board in a state in which the single side surface of the electronic device faces the outer principal surface of the circuit board,
wherein an end portion of the mounting electrode near the joining body is located further toward the insulating substrate than an end portion of the groove near the joining body, and a fillet of the joining material is disposed in a region of the groove near the joining body, and
wherein the groove is disposed only in the side surface of the insulating substrate.

2. The electronic module according to claim 1, wherein the insulating substrate further comprises a second principal surface that opposes the first principal surface,
wherein the groove extends over an entire length of the side surface of the insulating substrate in the thickness direction, and
wherein the mounting electrode extends to the second principal surface.

3. The electronic module according to claim 2, wherein the second principal surface of the insulating substrate comprises a step portion having a recessed shape at a peripheral portion near the single side surface, and
wherein an end portion of the groove near the second principal surface is disposed in the step portion.

4. The electronic module according to claim 3, wherein the mounting electrode covers an entire area of the second principal surface in the step portion.

5. The electronic module according to claim 4, wherein a plurality of the grooves is disposed in the single side surface, and a plurality of the step portions is disposed in the second principal surface, and
wherein the step portions are in one-to-one correspondence with the grooves.

6. The electronic module according to claim 1, wherein the groove is disposed only in a portion of the side surface of the insulating substrate in the thickness direction.

7. The electronic module according to claim 1, further comprising:
an auxiliary mounting electrode disposed on the inner surface of the groove, the auxiliary mounting electrode being apart from the mounting electrode in the thickness direction;
an auxiliary connecting circuit portion disposed on the outer principal surface of the circuit board and facing the auxiliary mounting electrode; and
an auxiliary joining material connected to the auxiliary mounting electrode and the auxiliary connecting circuit portion in the groove,
wherein a fillet of the auxiliary joining material is disposed between the mounting electrode and the auxiliary mounting electrode that are apart from each other.

* * * * *